(12) United States Patent
Wober

(10) Patent No.: US 8,866,065 B2
(45) Date of Patent: Oct. 21, 2014

(54) NANOWIRE ARRAYS COMPRISING FLUORESCENT NANOWIRES

(75) Inventor: Munib Wober, Topsfield, MA (US)

(73) Assignee: Zena Technologies, Inc., Cambridge, MA (US)

( * ) Notice: Subject to any disclaimer, the term of this patent is extended or adjusted under 35 U.S.C. 154(b) by 594 days.

(21) Appl. No.: 12/966,573

(22) Filed: Dec. 13, 2010

(65) Prior Publication Data

US 2012/0147587 A1    Jun. 14, 2012

(51) Int. Cl.

| | |
|---|---|
| *G01J 1/04* | (2006.01) |
| *G01J 1/42* | (2006.01) |
| *G01J 5/08* | (2006.01) |
| *B82Y 20/00* | (2011.01) |
| *C01B 31/02* | (2006.01) |
| *C01B 3/00* | (2006.01) |
| *H01L 29/06* | (2006.01) |

(52) U.S. Cl.
CPC .............. *B82Y 20/00* (2013.01); *C01B 3/0021* (2013.01); *C01B 31/022* (2013.01); *C01B 2202/06* (2013.01); *H01L 29/0669* (2013.01); *Y10S 977/95* (2013.01)
USPC ........................ 250/227.11; 257/432; 977/950

(58) Field of Classification Search
CPC ............ C01B 31/0206; C01B 2202/00; C01B 31/022; C01B 3/0021; C01B 2202/02; C01B 2202/04; C01B 2202/06; C01B 2202/08; C01B 2202/10; H01L 2221/1094; H01L 21/02603; H01L 21/02606; H01L 51/0048; H01L 29/0669; H01L 51/0045

USPC .......... 250/227.11; 362/84; 359/853; 257/13, 257/40, 432, 80, 12, 18, 19; 438/29, 478, 438/357; 385/123; 977/950, 954, 742, 750
See application file for complete search history.

(56) References Cited

U.S. PATENT DOCUMENTS

| | | | |
|---|---|---|---|
| 1,918,848 | A | 4/1929 | Land |
| 3,903,427 | A | 9/1975 | Pack |
| 4,017,332 | A | 4/1977 | James |
| 4,357,415 | A | 11/1982 | Hartman |
| 4,387,265 | A | 6/1983 | Dalal |
| 4,400,221 | A | 8/1983 | Rahilly |
| 4,443,890 | A | 4/1984 | Eumurian |
| 4,513,168 | A | 4/1985 | Borden |
| 4,620,237 | A | 10/1986 | Traino |

(Continued)

FOREIGN PATENT DOCUMENTS

| | | |
|---|---|---|
| EP | 0809303 B1 | 9/2006 |
| GB | 2348399 A | 4/2000 |

(Continued)

OTHER PUBLICATIONS

U.S. Office Action for U.S. Appl. No. 13/494,661, notification date Nov. 7, 2012.

(Continued)

*Primary Examiner* — Francis M Legasse, Jr.
(74) *Attorney, Agent, or Firm* — Pillsbury Winthrop Shaw Pittman LLP

(57) ABSTRACT

Described herein is a nanowire array, comprising a substrate, a plurality of fluorescent nanowires extending essentially perpendicularly from the substrate and a reflective layer disposed on the substrate in areas between the fluorescent nanowires; wherein the fluorescent nanowires are operable to fluoresce at a wavelength of a collective mode of the nanowire array.

36 Claims, 9 Drawing Sheets

(56) References Cited

U.S. PATENT DOCUMENTS

| | | |
|---|---|---|
| 4,678,772 A | 7/1987 | Segal et al. |
| 4,827,335 A | 5/1989 | Saito |
| 4,846,556 A | 7/1989 | Haneda |
| 4,880,613 A | 11/1989 | Satoh et al. |
| 4,896,941 A | 1/1990 | Hayashi |
| 4,950,625 A | 8/1990 | Nakashima et al. |
| 4,971,928 A | 11/1990 | Fuller |
| 4,972,244 A | 11/1990 | Buffet |
| 5,096,520 A | 3/1992 | Faris |
| 5,124,543 A | 6/1992 | Kawashima |
| 5,247,349 A | 9/1993 | Olego |
| 5,272,518 A | 12/1993 | Vincent |
| 5,311,047 A | 5/1994 | Chang |
| 5,347,147 A | 9/1994 | Jones |
| 5,362,972 A | 11/1994 | Yazawa |
| 5,374,841 A | 12/1994 | Goodwin |
| 5,401,968 A | 3/1995 | Cox |
| 5,449,626 A | 9/1995 | Hezel |
| 5,468,652 A | 11/1995 | Gee |
| 5,602,661 A | 2/1997 | Schadt |
| 5,612,780 A | 3/1997 | Rickenbach |
| 5,671,914 A | 9/1997 | Kalkhoran |
| 5,696,863 A | 12/1997 | Kleinerman |
| 5,723,945 A | 3/1998 | Schermerhorn |
| 5,747,796 A | 5/1998 | Heard |
| 5,767,507 A | 6/1998 | Unul |
| 5,798,535 A | 8/1998 | Huang |
| 5,844,290 A | 12/1998 | Furumiya |
| 5,853,446 A | 12/1998 | Carre |
| 5,857,053 A | 1/1999 | Kane |
| 5,877,492 A | 3/1999 | Fujieda |
| 5,880,495 A | 3/1999 | Chen |
| 5,885,881 A | 3/1999 | Ojha |
| 5,900,623 A | 5/1999 | Tsang et al. |
| 5,943,463 A | 8/1999 | Unuma |
| 5,968,528 A | 10/1999 | Deckner et al. |
| 6,033,582 A | 3/2000 | Lee |
| 6,037,243 A | 3/2000 | Ha et al. |
| 6,046,466 A | 4/2000 | Ishida et al. |
| 6,074,892 A | 6/2000 | Bowers et al. |
| 6,100,551 A | 8/2000 | Lee |
| 6,270,548 B1 | 8/2001 | Campbell et al. |
| 6,301,420 B1 | 10/2001 | Greenaway |
| 6,326,649 B1 | 12/2001 | Chang |
| 6,388,243 B1 | 5/2002 | Berezin |
| 6,388,648 B1 | 5/2002 | Clifton |
| 6,407,439 B1 | 6/2002 | Hier |
| 6,459,034 B2 | 10/2002 | Muramoto et al. |
| 6,463,204 B1 | 10/2002 | Ati |
| 6,542,231 B1 | 4/2003 | Garrett |
| 6,563,995 B2 | 5/2003 | Keaton |
| 6,566,723 B1 | 5/2003 | Vook |
| 6,680,216 B2 | 1/2004 | Kwasnick et al. |
| 6,709,929 B2 | 3/2004 | Zhang |
| 6,720,594 B2 | 4/2004 | Rahn |
| 6,771,314 B1 | 8/2004 | Bawolek |
| 6,805,139 B1 | 10/2004 | Savas |
| 6,812,473 B1 | 11/2004 | Amemiya |
| 6,927,145 B1 | 8/2005 | Yang |
| 6,960,526 B1 | 11/2005 | Shah |
| 6,967,120 B2 | 11/2005 | Jang |
| 6,969,899 B2 | 11/2005 | Yaung |
| 6,987,258 B2 | 1/2006 | Mates |
| 6,996,147 B2 | 2/2006 | Majumdar |
| 7,052,927 B1 | 5/2006 | Fletcher |
| 7,064,372 B2 | 6/2006 | Duan |
| 7,105,428 B2 | 9/2006 | Pan |
| 7,109,517 B2 | 9/2006 | Zaidi |
| 7,153,720 B2 | 12/2006 | Augusto |
| 7,163,659 B2 | 1/2007 | Stasiak |
| 7,208,783 B2 | 4/2007 | Palsule |
| 7,230,286 B2 | 6/2007 | Cohen |
| 7,235,475 B2 | 6/2007 | Kamins |
| 7,241,434 B2 | 7/2007 | Anthony et al. |
| 7,254,151 B2 | 8/2007 | Lieber |
| 7,262,400 B2 | 8/2007 | Yaung |
| 7,265,328 B2 | 9/2007 | Mouli |
| 7,272,287 B2 | 9/2007 | Bise |
| 7,285,812 B2 | 10/2007 | Tang et al. |
| 7,306,963 B2 | 12/2007 | Linden |
| 7,307,327 B2 | 12/2007 | Bahl |
| 7,311,889 B2 | 12/2007 | Awano |
| 7,330,404 B2 | 2/2008 | Peng |
| 7,335,962 B2 | 2/2008 | Mouli |
| 7,336,860 B2 | 2/2008 | Cyr |
| 7,358,583 B2 | 4/2008 | Reznik |
| 7,381,966 B2 | 6/2008 | Starikov |
| 7,416,911 B2 | 8/2008 | Heath et al. |
| 7,446,025 B2 | 11/2008 | Cohen |
| 7,462,774 B2 | 12/2008 | Roscheisen |
| 7,471,428 B2 | 12/2008 | Ohara |
| 7,491,269 B2 | 2/2009 | Legagneux |
| 7,507,293 B2 | 3/2009 | Li |
| 7,521,322 B2 | 4/2009 | Tang et al. |
| 7,524,694 B2 | 4/2009 | Adkisson |
| 7,582,857 B2 | 9/2009 | Gruev |
| 7,598,482 B1 | 10/2009 | Verhulst |
| 7,622,367 B1 | 11/2009 | Nuzzo |
| 7,626,685 B2 | 12/2009 | Jin |
| 7,646,138 B2 | 1/2010 | Williams |
| 7,646,943 B1 | 1/2010 | Wober |
| 7,647,695 B2 | 1/2010 | MacNutt |
| 7,649,665 B2 | 1/2010 | Kempa et al. |
| 7,655,860 B2 | 2/2010 | Parsons |
| 7,663,202 B2 | 2/2010 | Wang et al. |
| 7,692,860 B2 | 4/2010 | Sato et al. |
| 7,704,806 B2 | 4/2010 | Chae |
| 7,713,779 B2 | 5/2010 | Firon |
| 7,719,678 B2 | 5/2010 | Kamins |
| 7,719,688 B2 | 5/2010 | Kamins |
| 7,732,769 B2 | 6/2010 | Snider |
| 7,732,839 B2 | 6/2010 | Sebe |
| 7,736,954 B2 | 6/2010 | Hussain |
| 7,740,824 B2 | 6/2010 | Godfried et al. |
| 7,790,495 B2 | 9/2010 | Assefa et al. |
| 7,888,155 B2 | 2/2011 | Chen |
| 8,030,729 B2 | 10/2011 | Quitoriano |
| 8,035,184 B1 | 10/2011 | Dutta et al. |
| 8,049,203 B2 | 11/2011 | Samuelson |
| 8,063,450 B2 | 11/2011 | Wernersson et al. |
| 8,067,299 B2 | 11/2011 | Samuelson |
| 8,084,728 B2 | 12/2011 | Tsang |
| 8,093,675 B2 | 1/2012 | Tsunemi et al. |
| 8,118,170 B2 | 2/2012 | Sato |
| 8,143,658 B2 | 3/2012 | Samuelson |
| 8,193,524 B2 | 6/2012 | Bjoerk |
| 8,208,776 B2 | 6/2012 | Tokushima |
| 8,212,136 B2 | 7/2012 | Shirai |
| 8,212,138 B2 | 7/2012 | Landis |
| 8,222,705 B2 | 7/2012 | Ogino |
| 8,242,353 B2 | 8/2012 | Karg |
| 8,269,985 B2 | 9/2012 | Wober |
| 8,274,039 B2 | 9/2012 | Wober |
| 8,299,472 B2 | 10/2012 | Yu et al. |
| 8,330,090 B2 | 12/2012 | Agarwal |
| 8,384,007 B2 | 2/2013 | Yu et al. |
| 8,455,857 B2 | 6/2013 | Samuelson |
| 8,546,742 B2 | 10/2013 | Wober |
| 2002/0003201 A1 | 1/2002 | Yu |
| 2002/0020846 A1 | 2/2002 | Pi et al. |
| 2002/0021879 A1 | 2/2002 | Lee |
| 2002/0104821 A1 | 8/2002 | Bazylenko |
| 2002/0109082 A1 | 8/2002 | Nakayama |
| 2002/0130311 A1 | 9/2002 | Lieber |
| 2002/0172820 A1 | 11/2002 | Majumdar |
| 2003/0003300 A1 | 1/2003 | Korgel |
| 2003/0006363 A1 | 1/2003 | Campbell |
| 2003/0077907 A1 | 4/2003 | Kao et al. |
| 2003/0089899 A1 | 5/2003 | Lieber |
| 2003/0103744 A1 | 6/2003 | Koyama |
| 2003/0132480 A1 | 7/2003 | Chau |
| 2003/0189202 A1 | 10/2003 | Li |
| 2003/0227090 A1 | 12/2003 | Okabe |
| 2004/0026684 A1 | 2/2004 | Empedocles |

(56) References Cited

U.S. PATENT DOCUMENTS

| | | |
|---|---|---|
| 2004/0058058 A1 | 3/2004 | Shchegolikhin |
| 2004/0065362 A1 | 4/2004 | Watabe |
| 2004/0075464 A1 | 4/2004 | Samuelson |
| 2004/0095658 A1* | 5/2004 | Buretea et al. ............... 359/853 |
| 2004/0109666 A1 | 6/2004 | Kim |
| 2004/0118337 A1 | 6/2004 | Mizutani |
| 2004/0118377 A1 | 6/2004 | Bloms |
| 2004/0122328 A1 | 6/2004 | Wang |
| 2004/0124366 A1 | 7/2004 | Zeng |
| 2004/0155247 A1 | 8/2004 | Benthien |
| 2004/0156610 A1 | 8/2004 | Charlton et al. |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block |
| 2004/0241965 A1 | 12/2004 | Merritt |
| 2004/0261840 A1 | 12/2004 | Schmit |
| 2005/0009224 A1 | 1/2005 | Yang |
| 2005/0082676 A1 | 4/2005 | Andry |
| 2005/0087601 A1 | 4/2005 | Gerst |
| 2005/0095699 A1 | 5/2005 | Miyauchi et al. |
| 2005/0116271 A1 | 6/2005 | Kato |
| 2005/0133476 A1 | 6/2005 | Islam |
| 2005/0161662 A1* | 7/2005 | Majumdar et al. ............ 257/18 |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0242409 A1 | 11/2005 | Yang |
| 2005/0284517 A1 | 12/2005 | Shinohara |
| 2006/0011362 A1 | 1/2006 | Tao |
| 2006/0038990 A1 | 2/2006 | Habib et al. |
| 2006/0113622 A1 | 6/2006 | Adkisson |
| 2006/0121371 A1 | 6/2006 | Wu |
| 2006/0146323 A1 | 7/2006 | Bratkovski |
| 2006/0162766 A1 | 7/2006 | Gee |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012980 A1 | 1/2007 | Duan |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1 | 4/2007 | Tennant |
| 2007/0082255 A1 | 4/2007 | Sun |
| 2007/0099292 A1 | 5/2007 | Miller |
| 2007/0104441 A1 | 5/2007 | Ahn et al. |
| 2007/0108371 A1 | 5/2007 | Stevens |
| 2007/0114622 A1 | 5/2007 | Adkisson |
| 2007/0120254 A1 | 5/2007 | Hurkx et al. |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1 | 6/2007 | Adkisson |
| 2007/0138459 A1 | 6/2007 | Wong |
| 2007/0139740 A1 | 6/2007 | Igura |
| 2007/0140638 A1 | 6/2007 | Yang |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0164270 A1 | 7/2007 | Majumdar |
| 2007/0170418 A1 | 7/2007 | Bowers |
| 2007/0172623 A1 | 7/2007 | Kresse |
| 2007/0187787 A1 | 8/2007 | Ackerson |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya et al. |
| 2007/0238265 A1 | 10/2007 | Kurashina |
| 2007/0238285 A1 | 10/2007 | Borden |
| 2007/0241260 A1 | 10/2007 | Jaeger |
| 2007/0246689 A1 | 10/2007 | Ge |
| 2007/0248958 A1 | 10/2007 | Jovanovich |
| 2007/0272828 A1 | 11/2007 | Xu |
| 2007/0285378 A1 | 12/2007 | Lankhorst |
| 2007/0290193 A1 | 12/2007 | Tucker |
| 2007/0290265 A1 | 12/2007 | Augusto |
| 2008/0001498 A1 | 1/2008 | Mueller |
| 2008/0029701 A1 | 2/2008 | Onozawa |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar et al. |
| 2008/0055451 A1 | 3/2008 | Kanbe |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori et al. |
| 2008/0108170 A1 | 5/2008 | Adkisson |
| 2008/0116537 A1 | 5/2008 | Adkisson |
| 2008/0128760 A1 | 6/2008 | Jun |
| 2008/0145965 A1 | 6/2008 | Reznik |
| 2008/0149914 A1 | 6/2008 | Samuelson et al. |
| 2008/0149944 A1 | 6/2008 | Samuelson |
| 2008/0157253 A1 | 7/2008 | Starikov |
| 2008/0166883 A1 | 7/2008 | Liu et al. |
| 2008/0169017 A1 | 7/2008 | Korevaar |
| 2008/0169019 A1 | 7/2008 | Korevaar |
| 2008/0173615 A1 | 7/2008 | Kim |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1 | 10/2008 | Szu |
| 2008/0266556 A1 | 10/2008 | Kamins |
| 2008/0277646 A1 | 11/2008 | Kim et al. |
| 2008/0283728 A1 | 11/2008 | Inoue |
| 2008/0283883 A1 | 11/2008 | Shim |
| 2008/0297281 A1 | 12/2008 | Ayazi et al. |
| 2008/0311693 A1 | 12/2008 | Maxwell |
| 2008/0311712 A1 | 12/2008 | Anwat et al. |
| 2009/0001498 A1 | 1/2009 | Wang |
| 2009/0020150 A1 | 1/2009 | Atwater |
| 2009/0032687 A1 | 2/2009 | Lapstun |
| 2009/0046362 A1 | 2/2009 | Guo |
| 2009/0046749 A1 | 2/2009 | Mizuuchi |
| 2009/0050204 A1 | 2/2009 | Habib |
| 2009/0057650 A1 | 3/2009 | Lieber |
| 2009/0072145 A1 | 3/2009 | Peczalski et al. |
| 2009/0121136 A1 | 5/2009 | Gruss et al. |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0153961 A1 | 6/2009 | Murakami et al. |
| 2009/0165844 A1 | 7/2009 | Dutta |
| 2009/0173976 A1 | 7/2009 | Augusto |
| 2009/0179225 A1 | 7/2009 | Fertig et al. |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Want et al. |
| 2009/0199597 A1 | 8/2009 | Danley |
| 2009/0201400 A1 | 8/2009 | Zhang et al. |
| 2009/0206405 A1 | 8/2009 | Doyle |

(56) References Cited

U.S. PATENT DOCUMENTS

| | | |
|---|---|---|
| 2009/0224245 A1 | 9/2009 | Umezaki |
| 2009/0224349 A1 | 9/2009 | Gambino |
| 2009/0230039 A1 | 9/2009 | Hoenig et al. |
| 2009/0233445 A1 | 9/2009 | Lee et al. |
| 2009/0243016 A1 | 10/2009 | Kawahara et al. |
| 2009/0244514 A1 | 10/2009 | Jin |
| 2009/0260687 A1 | 10/2009 | Park |
| 2009/0261438 A1 | 10/2009 | Choi |
| 2009/0266418 A1 | 10/2009 | Hu et al. |
| 2009/0266974 A1 | 10/2009 | Verhulst |
| 2009/0272423 A1 | 11/2009 | Niira |
| 2009/0278998 A1 | 11/2009 | El-Ghoroury et al. |
| 2009/0289320 A1 | 11/2009 | Cohen |
| 2009/0305454 A1 | 12/2009 | Cohen |
| 2010/0006817 A1 | 1/2010 | Ohlsson et al. |
| 2010/0019252 A1 | 1/2010 | Bratkovski et al. |
| 2010/0019296 A1 | 1/2010 | Cha |
| 2010/0019355 A1 | 1/2010 | Kamins |
| 2010/0090341 A1 | 4/2010 | Wan |
| 2010/0101633 A1 | 4/2010 | Park |
| 2010/0104494 A1 | 4/2010 | Meng et al. |
| 2010/0110433 A1 | 5/2010 | Nedelcu et al. |
| 2010/0116976 A1 | 5/2010 | Wober |
| 2010/0127153 A1 | 5/2010 | Agarwal |
| 2010/0132779 A1 | 6/2010 | Hong |
| 2010/0133986 A1 | 6/2010 | Kim et al. |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0178018 A1 | 7/2010 | Augusto |
| 2010/0186809 A1 | 7/2010 | Samuelson et al. |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke et al. |
| 2010/0244169 A1 | 9/2010 | Maeda et al. |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0277607 A1 | 11/2010 | Choi |
| 2010/0282314 A1 | 11/2010 | Coakley |
| 2010/0295019 A1 | 11/2010 | Wang et al. |
| 2010/0302440 A1 | 12/2010 | Wober |
| 2010/0304061 A1 | 12/2010 | Ye et al. |
| 2010/0308214 A1 | 12/2010 | Wober |
| 2010/0320444 A1 | 12/2010 | Dutta |
| 2011/0018424 A1 | 1/2011 | Takada |
| 2011/0036396 A1 | 2/2011 | Jayaraman |
| 2011/0037133 A1 | 2/2011 | Su et al. |
| 2011/0050042 A1 | 3/2011 | Choi et al. |
| 2011/0080508 A1 | 4/2011 | Katsuno et al. |
| 2011/0127490 A1 | 6/2011 | Mi |
| 2011/0133060 A1 | 6/2011 | Yu et al. |
| 2011/0133160 A1 | 6/2011 | Yu et al. |
| 2011/0135814 A1 | 6/2011 | Miyauchi et al. |
| 2011/0139176 A1 | 6/2011 | Cheung et al. |
| 2011/0146771 A1 | 6/2011 | Chuang et al. |
| 2011/0147870 A1 | 6/2011 | Ang et al. |
| 2011/0180894 A1 | 7/2011 | Samuelson |
| 2011/0195577 A1 | 8/2011 | Kushibiki et al. |
| 2011/0226937 A1 | 9/2011 | Yu et al. |
| 2011/0248315 A1 | 10/2011 | Nam |
| 2011/0249219 A1 | 10/2011 | Evans |
| 2011/0249322 A1 | 10/2011 | Wang |
| 2011/0253982 A1 | 10/2011 | Wang et al. |
| 2011/0272014 A1 | 11/2011 | Mathai et al. |
| 2011/0297214 A1 | 12/2011 | Kim |
| 2011/0309237 A1 | 12/2011 | Seo et al. |
| 2011/0315988 A1 | 12/2011 | Yu et al. |
| 2011/0316106 A1 | 12/2011 | Kim |
| 2012/0009714 A1 | 1/2012 | Mouli |
| 2012/0029328 A1 | 2/2012 | Shimizu |
| 2012/0075513 A1 | 3/2012 | Chipman et al. |
| 2012/0196401 A1 | 8/2012 | Graham |
| 2012/0258563 A1 | 10/2012 | Ogino |

FOREIGN PATENT DOCUMENTS

| | | |
|---|---|---|
| JP | 359013708 A | 1/1984 |
| JP | 59198413708 | 1/1984 |
| JP | 2005252210 | 9/2005 |
| JP | 2007207091 | 8/2007 |
| TW | 200845402 | 11/2008 |
| TW | 200915551 | 4/2009 |
| WO | 86/03347 A1 | 6/1986 |
| WO | 0002379 | 1/2000 |
| WO | 0251715 | 5/2002 |
| WO | 03107439 A1 | 12/2003 |
| WO | 2005064337 | 7/2005 |
| WO | 2008069565 | 6/2008 |
| WO | 2008079076 | 7/2008 |
| WO | 2008131313 | 10/2008 |
| WO | 2008135905 | 11/2008 |
| WO | 2008135905 A3 | 11/2008 |
| WO | 2008143727 | 11/2008 |
| WO | 2009116018 | 9/2009 |
| WO | 2009137241 | 11/2009 |
| WO | 2010019887 | 2/2010 |
| WO | 2010039631 | 4/2010 |

OTHER PUBLICATIONS

International Search Report and Written Opinion for PCT International Patent Application No. PCT/US2011/060348, mailed Mar. 9, 2012.

International Search Report and Written Opinion for PCT International Patent Application No. PCT/US2011/064635, mailed Apr. 13, 2012.

International Search Report and Written Opinion for PCT International Patent Application No. PCT/US2011/066097, mailed Mar. 12, 2012.

International Search Report and Written Opinion for PCT International Patent Application No. PCT/US2011/067712, mailed May 3, 2012.

International Preliminary Search Report on Patentability of PCT/US201-057325, mailed May 2, 2013.

Deptuch et al., Vertically Integrated Circuits at Fermilab, IEEE Transactions on Nuclear Science, Aug. 2010, vol. 54, Issue 4, pp. 2178-2186.

Gadelrab et al., The Source-Gated Amorphous Silicon Photo-Transistor, IEEE Transactions on Electron Devices, Oct. 1997, vol. 44, No. 10, pp. 1789-1794.

Guillaumée, et al., Polarization Sensitive Silicon Photodiodes Using Nanostructured Metallic Grids, Applied Physics Letters 94, 2009.

Junger, et. al., Polarization- and wavelength-sensitive sub-wavelength structures fabricated in the metal layers of deep submicron CMOS processes, Proc. of SPIE, vol. 7712, 2010.

Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.

Loose et al., CMOS Detector Technology, Scientific Detector Workshop, Sicily, 2005, Experimental Astronomy, vol. 19, Issue 1-3, pp. 111-134.

Sarkar et. al., Integrated polarization-analyzing CMOS image sensor for detecting incoming light ray direction, Sensors Application Symposium (SAS) p. 194-199, 1010 IEEE.

Ye et al., Fabrication Techniques of High Aspect Ratio Vertical Lightpipes Using a Dielectric Photo Mask, SPIE, Proceedings, Feb. 2010, vol. 7591.

CMOS image sensor pixel microlens array optimization using FDTD Solutions, http://www.lumerical_com/ fdtd_microlens/cmos_image_sensor_pixel_microlens.php, pp. 1-2, Jun. 25, 2008.

"CMOS image sensor pixel optical efficiency and optical crosstalk optimization using FDTD Solutions" www.lumerical.com/fdtd_microlens/cmos_image_sensor_pixel_microlens.php, Mar. 19, 2009.

(56) References Cited

OTHER PUBLICATIONS

Adler, Nanowire Lawns Make for Sheets of Image Sensors, NewScientist.com, Jul. 28, 2008.
Baillie et al., 'Zero-space microlenses for CMOS image sensors: optical modeling and lithographic process development', Publication Date May 2004, http://adsabs.harvard.edu/abs/2004SPIE.5377.. 953B, pp. 1-2.vbTab.
Chung, Sung-Wook et al. Silicon Nanowire Devices. Applied Physics Letters, vol. 76, No. 15 (Apr. 10, 2000), pp. 2068-2070.
Ekroll, On the Nature of Simultaneous Color Contrast, Dissertation, University of Kiel, 2005.
Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.
Fang et al., Fabrication of Slantingly-Aligned Silicon Nanowire Arrays for Solar Cell Applications, Nanotechnology, 2008, vol. 19, No. 25.
Furumiya, et al. "High-sensitivity and no-crosstalk pixel technology for embedded CMOS image sensor"; IEEE Electron Device Letters, vol. 48, No. 10, Oct. 2001.
Gambino et al., 'CMOS Imager with Copper Wiring and Lightpipe,' Electron Devices Meeting, 2006. IEDM '06, International Publication Date: Dec. 11-13, 2006, pp. 1-4.
Garnett et al., Light Trapping in Silicon Nanowire Solar Cells, Nanoletters, Jan. 28, 2010, vol. 10, No. 3, pp. 1082-1087.
Ge et al., Orientation-Controlled Growth of Single-Crystal Silicon-Nanowire Arrays, Advanced Materials, Jan. 18, 2005, vol. 17, No. 1, pp. 56-61.
Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.
Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.
Hochbaum et al., Controlled Growth of Si Nanowire Arrays for Device Integration, Nano Letters, Mar. 2005, vol. 5, No. 3, pp. 457-460.
Holmes et al., Control of Thickness and Orientation of Solution-Grown Silicon Nanowires, Science, Feb. 25, 2000, vol. 287, No. 5457, pp. 1471-1473.
International Preliminary Report on Patentability for PCT International Patent Application No. PCT/U62009/055963, mailed Mar. 17, 2011.
International Search Report and Written Opinion for PCT International Application No. PCT/US2010/035722, mailed Jul. 20, 2010.
International Search Report and Written Opinion for PCT International Application No. PCT/US2010/035726, mailed Jul. 21, 2010.
International Search Report and Written Opinion for PCT International Application No. PCT/US2010/057227, mailed Jan. 26, 2011.
International Search Report and Written Opinion for PCT International Patent Application No. PCT/US2009/055963, mailed Oct. 15, 2009.vbTab.
International Search Report and Written Opinion for PCT International Patent Application No. PCT/US2010/035727, mailed Sep. 27, 2010.
International Search Report and Written Opinion for PCT International Patent Application No. PCT/US2010/051435, mailed Dec. 3, 2010.
International Search Report and Written Opinion for PCT International Patent Application No. PCT/US2010/059468, mailed Feb. 11, 2011.
International Search Report and Written Opinion for PCT International Patent Application No. PCT/US2010/059491, mailed Feb. 9, 2011.
International Search Report and Written Opinion for PCT International Patent Application No. PCT/US2010/059501, mailed Feb. 15, 2011.
International Search Report and Written Opinion for PCT International Patent Application No. PCT/US2010/059504, mailed Apr. 7, 2011.
Jin-Kon Kim; New Functional Nanomaterials Based on Block Copolymers' http://www.ziu.edu.cn/adver/subjectizyhd/jz0707061313.html.
Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.
Kalkofen et al., Atomic Layer Deposition of Boron Oxide as Dopant Source for Shallow Doping of Silicon, Meeting Abstract 943, 217th ECS Meeting, MA2010-01, Apr. 25-30, 2010, Vancouver Canada, El—Advance Gate Stack, Source / Drain, and Channel Engineering for Si-Based CMOS 6: New Materials, Processes, and Equipment.
Kane, Why Nanowires Make Great Photodetectors, EurekAlert.com article, Apr. 25, 2007.
Kempa, Thomas J. et al. Single and Tandem Axial p-i-n. Nanowire Photovoltaic Devices. Nano Letters. 2008, vol. 8, No. 10, 3456-3460.
Kim et al., Electronic Structure of Vertically Aligned Mn-Doped CoFe2O4 Nanowires and Their Application as Humidity Sensors and Photodetectors, Journal of Physical Chemistry C, Apr. 7, 2009.
Law, et al., 'Semiconductor Nanowires and Nanotubes'; Annu. Rev. Mater. Res. 2004, 34:83-122.
Lee et al., Vertical Pillar-Superlattice Array and Graphene Hybrid Light Emitting Diodes, Nano Letters, 2010, vol. 10, pp. 2783-2788.
Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.
Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., CRC Press, 2002, pp. 125-204.
Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Morales et al., A Laser Ablation Method for the Synthesis of Crystalline Semiconductor Nanowires, Science, Jan. 9, 1998, vol. 279, pp. 208-211.
N.L. Dmitruk, et al.; 'Modeling and Measurement of Optical Response of 1D Array of Metallic Nanowires for Sensing and Detection Application'; 26th International Conference on Microelectronics (MIEL 2008), Nis, Serbia, May 11-14, 2008.
Nguyen et al., Deep Reactive Ion etching of Polyimide for Microfluidic Applications, Journal of the Korean Physical Society, Sep. 2007, vol. 51, No. 3, pp. 984-988.
Ozgur Yavuzcetin, et al.; 'Index-tuned Anti-reflective Coating using a Nanostructured Metamaterial'; http://www.umass.edu/research/rld/bioportal/vuewtech.php?tid=40.
Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol. 15, No. 6.
Reynard Corporation; 'Anti-Reflection Coatings (AR)', http://www.reynardcorp.com/coating_anti_reflection.php.
Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.
Rugani, First All-Nanowire Sensor, Technology Review, Aug. 13, 2008, Published by MIT.

(56) References Cited

OTHER PUBLICATIONS

Schmidt et al., Realization of a Silicon Nanowire Vertical Surround-Gate Field-Effect Transistor, Small, Jan. 2006, vol. 2, No. 1, pp. 85-88.
Shimizu et al., Homoepitaxial Growth of Vertical Si Nanowires on Si(100) Substrate using Anodic Aluminum Oxide Template, (abstract only), Materials Research Society.
Song et al., Vertically Standing Ge Nanowires on GaAs(110) Substrates, Nanotechnology 19, Feb. 21, 2008.
T. H. Hsu, et al. 'Light Guide for Pixel Crosstalk Improvement in Deep Submicron CMOS Image Sensor'; IEEE Electron Device Letters, vol. 25, No. 1, Jan. 2004.
Thelander et al., Nanowire-Based One-Dimensional Electronics, Materials Today, Oct. 2006, vol. 9, No. 10, pp. 28-35.
Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.
Tseng, et al. 'Crosstalk improvement technology applicable to 0.14µm CMOS image sensor'; IEEE International Electron Devices Meeting, Dec. 13-15, 2004; IEDM Technical Digest, pp. 997-1000. vbTab.
Verheijen, Marcel A. et al. Growth Kinetics of Heterostructured GaP-GaAs Nanowires. J. Am. Chem. Soc. 2006, 128, 1353-1359.
Wagner, R.S. and Ellis, W.C. Vapor-Liquid-Solid Mechanism of Single Crystal Growth. Applied Physics Letters. vol. 4, No. 5 (Mar. 1, 1964), pp. 89-90.
Wang, Introduction to Nanotechnology—Where Opportunities arise & Great Future Being Built from Small Things.
Wong et al., Lateral Nanoconcentrator Nanowire Multijunction Photovoltaic Cells, GCEP Progress report, Apr. 20, 2009, pp. 1-18.
Zhang et al., Ultrahigh Responsivity Visible and Infrared Detection Using Silicon Nanowire Phototransistors, Nanoletters, May 14, 2010, vol. 10, No. 6, pp. 2117-2120.
International Search Report and Written Opinion for PCT International Patent Application No. PCT/US2010/051446, mailed Jan. 3, 2011.
International Search Report and Written Opinion for PCT International Patent Application No. PCT/US2009/063592, mailed Jan. 13, 2010.
International Preliminary Report and Written Opinion re PCT/US2010/059491, mailed Jun. 21, 2012.
International Search Report and Written Opinion re PCT/US2011/57325, mailed Jun. 22, 2012.
International Preliminary Report and Written Opinion re PCT/US2010/059468, mailed Jun. 21, 2012.
International Preliminary Report and Written Opinion re PCT/US2010/059504, mailed Jun. 21, 2012.
International Preliminary Report and Written Opinion re PCT/US2010/059496, mailed Jun. 21, 2012.
U.S. Office Action for U.S. Appl. No. 12/573,582, dated Jun. 28, 2012.
Baomin Wang and Paul W. Leu, Nanotechology 23 (2012) 194003, 7 pages.
Sangmoo Jeon, et al., Nano Lett. 2012, 12, 2971-2976.
Sangmoo Jeong et al., J. Vac. Sci. Technol. A 30(6), Nov./Dec. 2012.
Sarkar et. al., Integrated polarization-analyzing CMOS image sensor for detecting incoming light ray direction, Sensors Application Symposium (SAS), Mar. 29, 2012, p. 194-199, 1010 IEEE.
Jin-Kon Kim; 'New Functional Nanomaterials Based on Block Copolymers' http://www.ziu.edu.cn/adver/subjectizyhd/jz0707061313.html, Jul. 7, 2011.
Ozgur Yavuzcetin, et al.; 'Index-tuned Anti-reflective Coating using a Nanostructured Metamaterial'; http://www.umass.edu/research/rld/bioportal/vuewlech.php?tid=40, Feb. 28, 2007.
Reynard Corporation; 'Anti-Reflection Coatings (AR)', http://www.reynardcorp.com/coating_anti_reflection.php, undated.
Shimizu et al., Homoepitaxial Growth of Vertical Si Nanowires on Si(100) Substrate using Anodic Aluminum Oxide Template, (abstract only), Materials Research Society, Fall 2007.
Wang, Introduction to Nanotechnology—Where Opportunities arise & Great Future Being Built from Small Things, Fall 2008.
Babinec et al., High-Flux, Low-Power Diamond Nanowire Single-Photon Source Arrays: An Enabling Material for Optical and Quantum Computing and Cryptogrophy, obtained on Jul. 22, 2010 at url: <http://otd.harvard.edu/technologies/tech.php?case=3702>.
Loncar et al., Diamond Nanotechnology, SPIE Newsroom, May 18, 2010, obtained at url: <http://spie.org/x40194.xml?ArticleID=x40194>.
Rutter, Diamond-Based Nanowire Devices Advance Quantum Science, SEAS Communications, Feb. 14, 2010, obtained at url: <http://news_harvard.edu/gazette/story/2010/02/digging-deep-into-diamonds/>.
Barclay et al., Chip-Based Microcavities Coupled to NV Centers in Single Crystal Diamond, Applied Physics Letters, Nov. 12, 2009, vol. 95, Issue 19.
Brouri et al., Photon Antibunching in the Fluorescence of Individual Colored Centers in Diamond, Optics Letters, Sep. 1, 2000, vol. 25, Issue 17.
William Shockley and H. Queisser, Detailed Balance Limit of Efficiency of p-n Junction Solar Cells, J. of Appl. Physics, Mar. 1961, 32(3).
International Preliminary Report on Patentability for PCT International Application No. PCT/US2010/035722, mailed Nov. 3, 2011.
U.S. Office Action for U.S. Appl. No. 13/966,573, dated Aug. 6, 2013, 13 pages.
U.S. Office Action for U.S. Appl. No. 12/966,514, dated Aug. 15, 2013, 17 pages.
U.S. Office Action for U.S. Appl. No. 12/633,313, dated Aug. 1, 2013, 20 pages.
U.S. Office Action for U.S. Appl. No. 13/048,635, mailed Jun. 6, 2013, 24 pages.
U.S. Office Action for U.S. Appl. No. 12/966,535, mailed Jun. 14, 2013, 22 pages.
Canadian Office Action of Canadian Application No. 3,676,376, dated Oct. 11, 2013.
Catrysse, et al., An Integrated Color Pixel in 0.18pm CMOS Technology, Proceedings IEDM 2001, pp. 559-562.
Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.
Geyer et al., Model for the Mass Transport during Metal-Assisted Chemical Etching with Contiguous Metal Films as Catalysts, J. Phys. Chem. C 2012, 116, 13446-13451.
Hopkins, Addressing sidewall roughness using dry etching silicon and Si02, Jul. 1, 2004, ElectroIQ, vol. 47, Issue 7.
Mei-Ling Kuo et al. "Realization of a near-perfect antireflection coating for silicon solar energy utilization" (Nov. 1, 2008, vol. 33, No. 21, Optics Letters).
Mukhopadhyay, When PDMS Isn't the Best, American Chemical Society, May 1, 2007.
Seo, et. al., "Multicolored vertical silicon nanowires," Nano Letters, vol. 11, issue 4, pp. 1851-1856, 2010.
Taiwanese Office Action of Taiwan Patent Application No. 099116881, issued Jul. 18, 2013 (8 pages).
U.S. Final Office Action for U.S. Appl. No. 12/966,514, mailed Mar. 19, 2013, 50 pages.
U.S. Final Office Action for U.S. Appl. No. 13/494,661, mailed Mar. 7, 2013, 10 pages.
Office Action issued on Jan. 28, 2014 in Taiwanese Application No. 100146327.
Office Action issued on Mar. 17, 2014 in Korean Application No. 10-2013-7018243.
U.S. Office Action for U.S. Appl. No. 12/910,664, mailed Feb. 26, 2014.
U.S. Office Action for U.S. Appl. No. 12/966,514, mailed Feb. 25, 2014.
U.S. Office Action for U.S. Appl. No. 12/945,492 mailed May 13, 2014.

* cited by examiner

NANOWIRE ARRAYS COMPRISING FLUORESCENT NANOWIRES

CROSS-REFERENCE TO RELATED APPLICATIONS

This application is related to U.S. patent application Ser. Nos. 12/204,686 (granted as U.S. Pat. No. 7,646,943), 12/648,942, 12/270,233, 12/472,264, 12/472,271, 12/478,598, 12/573,582, 12/575,221, 12/633,323, 12/633,318, 12/633,313, 12/633,305, 12/621,497, 12/633,297, 61/266,064, 61/357,429, 61/306,421, 61/306,421, 12/910,664 and 12/910,664, the disclosures of which are hereby incorporated by reference in their entirety.

BACKGROUND

Nanostructures often exhibit fascinating physical properties not present in their bulk counterparts. Optical properties of nanostructures have been one of the recent research focuses. Tuning optical properties of nanostructures would facilitate their applications in the semiconductor, optics, and consumer electronics industry. In one example, optical properties of nanostructures can be controlled by their chemical composition. Chemical doping can change electronic structures of the materials semiconductor nanostructures are composed of, which in turn changes their interaction with light. In another example, arranging nanostructures into a regular lattice can yield optical properties individual nanostructures lack.

SUMMARY

According to an embodiment, a nanowire array comprises a substrate, a plurality of fluorescent nanowires extending essentially perpendicularly from the substrate and a reflective layer at least disposed on the substrate in at least a portion of areas between the fluorescent nanowires; wherein the fluorescent nanowires are operable to fluoresce at a wavelength of a collective mode of the nanowire array. An electrically conductive material can be a material with essentially zero band gap. The electrical conductivity of an electrically conductive material is generally above $10^3$ S/cm. A semiconductor can be a material with a finite band gap upto about 3 eV and general has an electrical conductivity in the range of $10^3$ to $10^{-8}$ S/cm. An electrically insulating material can be a material with a band gap greater than about 3 eV and generally has an electrical conductivity below $10^{-8}$ S/cm. The term "fluorescent nanowires extending essentially perpendicular to the substrate" as used herein means that angles between the fluorescent nanowires and the substrate are from about 85° to 90°. The term "array" as used herein means a spatial arrangement having a particular order. The term "nanowire" as used herein means a structure that has a size constrained to at most 1000 nm in two dimensions and unconstrained in the other dimension. The term "disposed" as used herein means position, deposited, plated, or coated. The term "areas between the fluorescent nanowires" as used herein means areas on the substrate that is not covered by the fluorescent nanowires, as shown in FIGS. 2 and 3. The term "fluorescent nanowires" as used herein means nanowires that can fluoresce. The term "fluoresce" as used herein means to exhibit or undergo the phenomenon of fluorescence. The term "fluorescence" as used herein means the emission of light by a substance that has absorbed light or other electromagnetic radiation of a different wavelength. The term "fluoresced light" as used herein means emitted light from fluorescence of a substance. In most cases, emitted light has a longer wavelength, and therefore lower energy, than the absorbed radiation. However, when the absorbed electromagnetic radiation is intense, it is possible for one electron to absorb two photons; this two-photon absorption can lead to emission of radiation having a shorter wavelength than the absorbed radiation. Fluorescence has many practical applications, including mineralogy, gemology, chemical sensors, fluorescent labeling, dyes, biological detectors, and, most commonly, fluorescent lamps. For example, the common fluorescent lamp relies on fluorescence. Inside the glass tube is a partial vacuum and a small amount of mercury. An electric discharge in the tube causes the mercury atoms to emit ultraviolet light. The tube is lined with a coating of a fluorescent material, called the phosphor, which absorbs the ultraviolet and re-emits visible light.

According to an embodiment, the substrate comprises a material comprising silicon, sapphire, glass silicon oxide, diamond, ZnO, a transparent non-absorbing dielectric material or a combination thereof. Glass is a non-crystalline solid material. The most prevalent type of glass, used for centuries in windows and drinking vessels, is soda-lime glass, made of about 75% silica ($SiO_2$) plus $Na_2O$, CaO, and several minor additives. Often, the term glass is used in a restricted sense to refer to this specific use. In science, however, the term glass is usually defined in a much wider sense, including every solid that possesses a non-crystalline (i.e. amorphous) structure and that exhibits a glass transition when heated towards the liquid state. In this wider sense, glasses can be made of quite different classes of materials: metallic alloys, ionic melts, aqueous solutions, molecular liquids, and polymers. Of these, polymer glasses (acrylic glass, polyethylene terephthalate) are the most important; for many applications (bottles, eyewear) they are a lighter alternative to traditional silica glasses.

According to an embodiment, the substrate has a thickness of about 0.1 to 1 mm.

According to an embodiment, the substrate comprises substantially a same material as or different materials from the fluorescent nanowires.

According to an embodiment, the reflective layer comprises a material selected from a group consisting of ZnO, Al, Au, Ag, Pd, Cr, Cu, and a combination thereof.

According to an embodiment, the reflective layer has a reflectance of at least 50% for fluoresced light from the fluorescent nanowires. The term "reflectance" as used herein means the fraction of incident electromagnetic power that is reflected at an interface.

According to an embodiment, the reflective layer has a thickness of at least 5 nm.

According to an embodiment, the reflective layer is also disposed on the substrate in at least a portion of areas covered by the fluorescent nanowires.

According to an embodiment, the fluorescent nanowires are at least partially embedded in a material. The term "embed" as used herein means to surround or cover something closely.

According to an embodiment, the material comprises silicon oxide, silicon nitride, ZnO, $Al_2O_3$, diamond or a combination thereof. The material can also comprise any suitable transparent and low absorption dielectric material.

According to an embodiment, a surface the material is substantially coextensive with a surface of each of the fluorescent nanowires such the surface of each of the fluorescent nanowires is exposed. The term "exposed" as used herein means not embedded by the material.

According to an embodiment, the fluorescent nanowires are entirely embedded in the material without any exposed surface.

According to an embodiment, a surface of the material has a concave shape configured to focus fluoresced light from the fluorescent nanowires.

According to an embodiment, a refractive index of the material is smaller than a refractive index of the fluorescent nanowires.

According to an embodiment, the nanowire array further comprises a partial reflective layer deposited on a surface of the material in at least a portion of areas around the surface of each of the fluorescent nanowires wherein no portion of the surface of each of the fluorescent nanowires overlaps the partial reflective layer when viewed from a direction perpendicular to the substrate.

According to an embodiment, the fluorescent nanowires comprise one or more fluorescent material. The term "fluorescent material" as used herein means a material that can fluoresce.

According to an embodiment, the fluorescent nanowires comprise a material selected from the group consisting of inorganic fluorescent materials, organic fluorescent materials and a combination thereof. Organic fluorescent materials, often referred to as organic dyes, include a large number organic molecules that can fluoresce. Several examples of organic fluorescent materials are acridine orange, SYBR Green (N',N'-dimethyl-N-[4-[(E)-(3-methyl-1,3-benzothiazol-2-ylidene)methyl]-1-phenylquinolin-1-ium-2-yl]-N-propylpropane-1,3-diamine), cyanines, $DiOC_6$ (3-Hexyl-2-[3-(3-hexyl-2(3H)benzoxazolylidene)-1-propenyl] benzoxazolium iodide, CAS number 53213-82-4), Nile blue, Nile red, oxazin dyes, phenanthridine dyes, Rhodamine dyes, etc. Inorganic fluorescent materials include a large number inorganic materials that can fluoresce. Several examples of inorganic fluorescent materials are $Zn_2SiO_4$:Mn, GaN, ZnO:Zn, ZnS:Ag, CdS:Ag, $MgF_2$:Mn, $InBO_3$:Tb, $LaPO_4$:Ce, etc. The inorganic fluorescent materials can also be suitable quantum dots (e.g. silicon). A quantum dot is a semiconductor whose excitons are confined in all three spatial dimensions.

According to an embodiment, the fluorescent nanowires are one or more non-fluorescent material with one or more fluorescent material embedded therein and covered thereby. The term "non-fluorescent material" as used herein means a material that cannot fluoresce.

According to an embodiment, the fluorescent nanowires are diamond with color centers embedded therein. Diamond is an allotrope of carbon, where the carbon atoms are arranged in a variation of the face-centered cubic crystal structure called a diamond lattice. The term "color center" as used herein means a point lattice defect which produces optical absorption bands in an otherwise transparent crystal. such as the alkali halides, alkaline earth fluorides, or metal oxides. Color centers are found in a wide range of materials. Color centers can be produced by gamma radiation or x-radiation, by addition of impurities or excess constituents, and sometimes through electrolysis. A well-known example is that of the F-center in alkali halides such as sodium chloride, NaCl. The designation F-center comes from the German word Farbe, which means color. F-centers in NaCl produce a band of optical absorption toward the blue end of the visible spectrum; thus the colored crystal appears yellow under transmitted light. On the other hand, KCl with F-centers appears magenta, and KBr appears blue.

According to an embodiment, the color centers are nitrogen vacancy defects.

According to an embodiment, the color centers are embedded randomly in the fluorescent nanowires.

According to an embodiment, at least 10% of the fluorescent nanowires have at least one color center.

According to an embodiment, the nanowire array further comprises a cladding layer surrounding a sidewall of each of the fluorescent nanowires wherein the cladding layer is a material substantially transparent to fluoresced light from the fluorescent nanowires. The term "cladding layer" as used herein means a layer of substance surrounding the structures.

According to an embodiment, a refractive index of cladding layer is smaller than a refractive index of the fluorescent nanowires.

According to an embodiment, the fluorescent nanowires are embedded in a material and wherein a refractive index of cladding layer is greater than the refractive index of the material.

According to an embodiment, the fluorescent nanowires have a substantially uniform length. The term "substantially uniform length" as used herein means all lengths of the fluorescent nanowires are from 90% to 110% of a mean value of all the lengths.

According to an embodiment, fluoresced light of the fluorescent nanowires is substantially spatially and/or temporally coherent. Coherence describes all properties of the correlation between physical quantities of a wave. When interfering, two waves can add together to create a larger wave (constructive interference) or subtract from each other to create a smaller wave (destructive interference), depending on their relative phase. Two waves are said to be coherent if they have a constant relative phase. The degree of coherence is measured by the interference visibility, a measure of how perfectly the waves can cancel due to destructive interference. Temporal coherence is the measure of the average correlation between the value of a wave at any pair of times, separated by delay T. Temporal coherence tells us how monochromatic a source is. In other words, it characterizes how well a wave can interfere with itself at a different time. Spatial coherence describes the ability for two points in space, x1 and x2, in the extent of a wave to interfere, when averaged over time. More precisely, the spatial coherence is the cross-correlation between two points in a wave for all times.

According to an embodiment, the wavelength of the collective mode of the nanowire array is substantially equal to a pitch of the nanowire array, which as used herein means the wavelength of the collective mode of the nanowire array is from 90% to 110% of the pitch of the nanowire array.

According to an embodiment, a length of the fluorescent nanowires is a multiple of an effective wavelength $\lambda_{eff}$ defined as $\lambda_{eff}=\lambda_{air}/n_{eff}$, wherein $\lambda_{air}$ is the wavelength of interest and neff is an effective refractive index of the nanowire array at $\lambda_{air}$.

According to an embodiment, the collective mode is an air mode.

According to an embodiment, a pitch of the nanowire array is about 100 nm to 10 micron, a length of the fluorescent nanowires is from about 100 nm to 10 microns, and/or a radius of the fluorescent nanowires is about 20 to 200 nm.

According to an embodiment, a light source comprises one or more of the nanowire array.

According to an embodiment, a method of using the nanowire array comprises exposing the nanowire array to light.

According to an embodiment, the light has a shorter wavelength than the wavelength of the wavelength of the collective mode of the nanowire array.

According to an embodiment, the light is provided by a source selected from the group consisting of LEDs, fluorescent lamps, mercury-vapor lamps, sodium-vapor lamps, discharge lamps, sunlight, incandescent lamps and/or laser.

According to an embodiment, a method of designing a nanowire array that fluoresces at a wavelength of interest comprises: selecting the wavelength of interest; selecting a pitch of the nanowire array to be substantially equal to the wavelength of interest; selecting a radius of fluorescent nanowires of the nanowire array that maximizes fluorescence intensity of the nanowire array at the wavelength of interest; selecting a material of the fluorescent nanowires such that the fluorescent nanowires fluoresce at the wavelength of interest. The term "fluorescence intensity" as used herein means light intensity of fluoresced light.

According to an embodiment, a method of manufacturing the nanowire array comprises providing a substrate; growing fluorescent nanowires on the substrate such that the fluorescent nanowires extend essentially perpendicularly from the substrate and the fluorescent nanowires are operable to fluoresce at a wavelength of a collective mode of the nanowire array; depositing the reflective layer at least on the substrate in at least a portion of areas between the fluorescent nanowires. A resist layer as used herein means a thin layer used to transfer a pattern to the substrate which the resist layer is deposited upon. A resist layer can be patterned via lithography to form a (sub)micrometer-scale, temporary mask that protects selected areas of the underlying substrate during subsequent processing steps. The resist is generally proprietary mixtures of a polymer or its precursor and other small molecules (e.g. photoacid generators) that have been specially formulated for a given lithography technology. Resists used during photolithography are called photoresists. Resists used during e-beam lithography are called e-beam resists. A lithography technique can be photolithography, e-beam lithography, holographic lithography. Photolithography is a process used in microfabrication to selectively remove parts of a thin film or the bulk of a substrate. It uses light to transfer a geometric pattern from a photo mask to a light-sensitive chemical photo resist, or simply "resist," on the substrate. A series of chemical treatments then engraves the exposure pattern into the material underneath the photo resist. In complex integrated circuits, for example a modern CMOS, a wafer will go through the photolithographic cycle up to 50 times. E-beam lithography is the practice of scanning a beam of electrons in a patterned fashion across a surface covered with a film (called the resist), ("exposing" the resist) and of selectively removing either exposed or non-exposed regions of the resist ("developing"). The purpose, as with photolithography, is to create very small structures in the resist that can subsequently be transferred to the substrate material, often by etching. It was developed for manufacturing integrated circuits, and is also used for creating nanotechnology artifacts.

According to an embodiment, a method of manufacturing the nanowire array of comprises: providing a substrate having a layer of fluorescent material; coating a resist layer on the layer of fluorescent material; patterning the resist layer using a lithographic technique such that a pattern corresponding to a plurality of fluorescent nanowires is formed in the resist layer; forming the fluorescent nanowires by etching the layer of fluorescent material such that the fluorescent nanowires extend essentially perpendicularly from the substrate and the fluorescent nanowires are operable to fluoresce at a wavelength of a collective mode of the nanowire array; depositing a reflective layer at least on the substrate in at least a portion of areas between the fluorescent nanowires.

According to an embodiment, the method further comprises a step of coating a cladding layer surrounding a sidewall of the fluorescent nanowires; and/or a step of filling space between the fluorescent nanowires with a material.

According to an embodiment, a method of manufacturing a nanowire array comprising: providing a substrate; growing nanowires on the substrate such that the nanowires extend essentially perpendicularly from the substrate; depositing a fluorescent material on or embedding a fluorescent material in the nanowires followed by an optional annealing step such that the nanowires are operable to fluoresce at a wavelength of a collective mode of the nanowire array; depositing the reflective layer at least on the substrate in at least a portion of areas between the nanowires.

According to an embodiment, a method of manufacturing a nanowire array comprising: providing a substrate having a layer of a material; coating a resist layer on the layer of the material; patterning the resist layer using a lithographic technique such that a pattern corresponding to a plurality of nanowires is formed in the resist layer; forming the nanowires by etching the layer of fluorescent material such that the nanowires extend essentially perpendicularly from the substrate; depositing a fluorescent material on or embedding a fluorescent material in the nanowires followed by an optional annealing step such that the nanowires are operable to fluoresce at a wavelength of a collective mode of the nanowire array; depositing a reflective layer at least on the substrate in at least a portion of areas between the nanowires.

According to an embodiment, the method further comprises a step of coating a cladding layer surrounding a sidewall of the nanowires; and/or a step of filling space between the nanowires with a material.

BRIEF DESCRIPTION OF THE DRAWINGS

Embodiments of the present disclosure will now be disclosed, by way of example only, with reference to the accompanying schematic drawings in which corresponding reference symbols indicate corresponding parts, in which.

DETAILED DESCRIPTION

Figure 1:
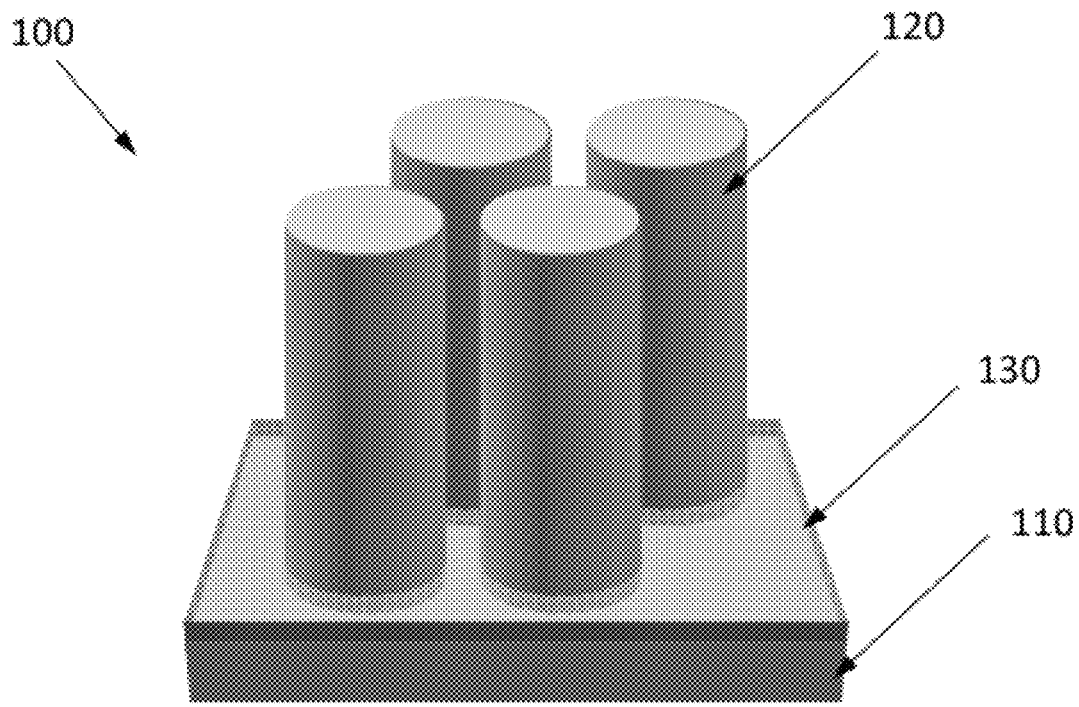
FIG. 1 shows a schematic perspective view of a nanowire array, according to an embodiment.

In the following detailed description, reference is made to the accompanying drawings, which form a part thereof. In the drawings, similar symbols typically identify similar components, unless the context dictates otherwise. The illustrative embodiments described in the detail description, drawings, and claims are not meant to be limiting. Other embodiments may be utilized, and other changes may be made, without departing from the spirit or scope of the subject matter presented here.

Figure 2:
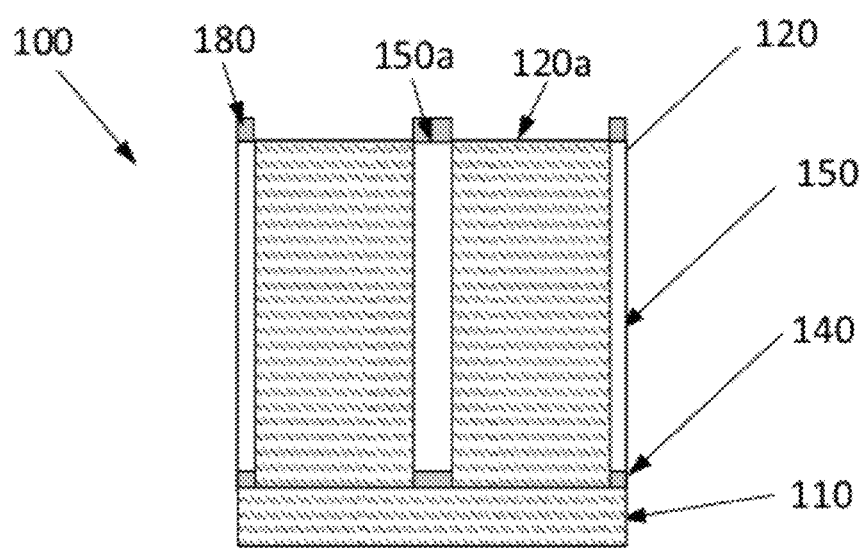
FIG. 2 shows a schematic cross-sectional view of the nanowire array of FIG. 1, according to an embodiment.

FIGS. 1 and 2 are a schematic perspective view and a schematic cross-sectional view of a nanowire array 100, respectively, according to an embodiment. The nanowire array 100 comprises a substrate 110, a plurality of fluorescent nanowires 120, a reflective layer 140 disposed on the substrate 110 in areas between the fluorescent nanowires 120. The fluorescent nanowires 120 can be embedded in a material 150.

The substrate 110 can be any suitable material, such as, silicon, sapphire, glass, silicon oxide, etc. The substrate 110 and the fluorescent nanowires 120 can be the same material or different materials. The substrate 110 can have any suitable thickness such as 0.1-1 mm. Examples of the substrate 110 include a silicon wafer, a sapphire wafer, and a glass wafer.

The reflective layer 140 can be any suitable material, such as ZnO, Al, Au, Ag, Pd, Cr, Cu, a combination thereof, etc. The reflective layer 140 preferably has a reflectance of at least 50%, more preferably has a reflectance of at least 70%, most preferably has a reflectance of at least 90%, for fluoresced light from the fluorescent nanowires 120. The reflective layer 140 has a thickness of preferably at least 5 nm, more preferably at least 20 nm. In addition to the areas between the fluorescent nanowires 120, the reflective layer 140 can also be disposed on the substrate 110 in areas under the fluorescent nanowires 120.

Figure 3:
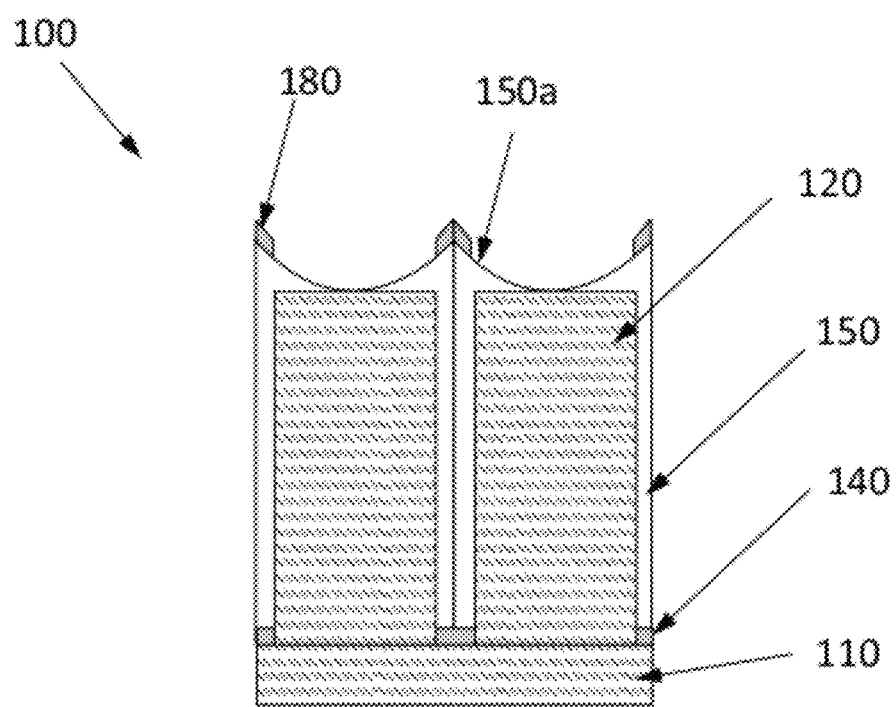
FIG. 3 shows an alternative schematic cross-sectional view of the nanowire array of FIG. 1, according to an embodiment.

The material 150 in which the are embedded can be any suitable material substantially transparent to fluoresced light from the fluorescent nanowires 120. For example, the material 150 can be silicon oxide, silicon nitride or a combination thereof. A surface 150a of the material 150 can be substantially coextensive with surfaces 120a of the fluorescent nanowires 120 such that the surfaces 120a of the fluorescent nanowires 120 are exposed. Alternatively, the fluorescent nanowires 120 can be entirely buried in the material 150 without any exposed surface. As shown in FIG. 3, the surface 150a of the material 150 can have a concave shape effective to focus fluoresced light from the fluorescent nanowires 120. A refractive index of the material 150 is preferably smaller than a refractive index of the fluorescent nanowires 120. A partial reflective layer 180 can be deposited on the surface 150a in areas around the surfaces 120a wherein no portion of the surfaces 120a overlaps the partial reflective layer 180. The term "partial reflective layer" as used herein means a layer with a reflectance less than 100%. For example, a partial reflective layer can be a layer of Ag or Al with a thickness less than 10 nm.

The fluorescent nanowires 120 can comprise one or more suitable fluorescent material, such as GaN, ZnO, organic fluorescent materials, or a combination thereof. The fluorescent nanowires 120 can also be one or more non-fluorescent material with one or more fluorescent material embedded therein and covered thereby, such as diamond with color centers embedded therein. Fluorescence is the emission of light by a substance that has absorbed light or other electromagnetic radiation of a different wavelength from emitted light. In most cases, the emitted light has a longer wavelength, and therefore lower energy, than the absorbed radiation. In an example, the fluorescent nanowires 120 are diamond with nitrogen vacancy defects as the color centers. The color centers can be embedded randomly in the fluorescent nanowires 120. In a given nanowire array 100, at least 100%, 75%, 50%, 25%, or 10% of the fluorescent nanowires 120 have at least one color center. A nitrogen vacancy defect (also referred to as a nitrogen vacancy center) is one of numerous point defects in diamond consisting of a substitutional nitrogen atom and a vacancy in an adjacent site of the diamond lattice. Diamond with embedded nitrogen vacancy defects can be created by irradiating nitrogen doped diamond with 1-2 MeV electrons followed by annealing in vacuum at about 850-1000° C. for about 2-20 hours. Nitrogen vacancy defects are resistant to photobleaching, i.e., fluorescence intensity of nitrogen vacancy defects remains unchanged after several hours of continuous laser irradiation in the saturation regime. The saturation regime as used here in means a range of laser irradiation intensity in which fluorescence intensity of the nitrogen vacancy defects is independent from the laser irradiation intensity. Nitrogen vacancy defects can have high quantum yield at temperatures up to in excess of 500 K. A nitrogen vacancy defect can fluoresce at wavelengths such as 637 nm and 531 nm, depending on the symmetry of the nitrogen atom of the nitrogen vacancy defect relative to the diamond lattice. The term "quantum yield" gives the efficiency of the fluorescence process and is defined as the ratio of the number of photons emitted to the number of photons absorbed. The fluorescent nanowires 120 can have any cross-sectional shape. For example, the fluorescent nanowires 120 can be cylinders or prisms with elliptical, circular, rectangular, polygonal cross-sections.

Figure 4:
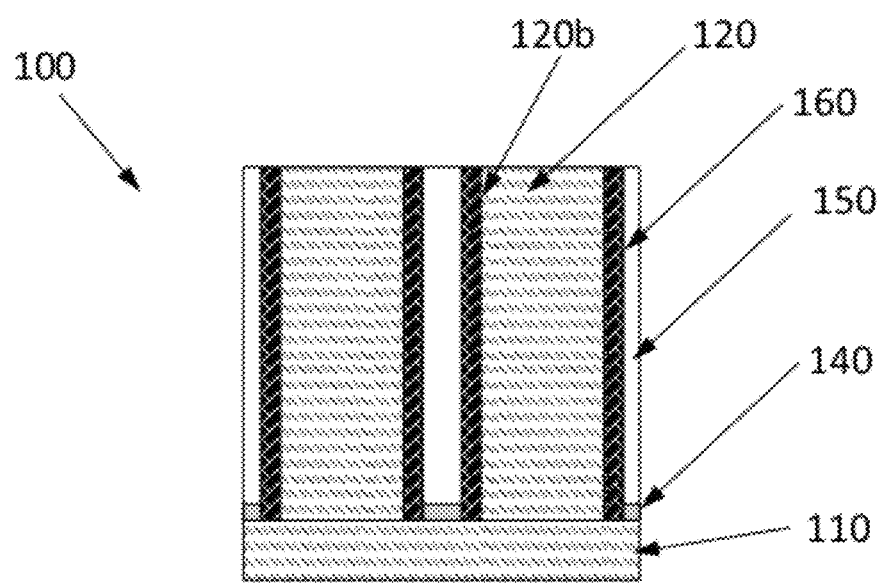
FIG. 4 shows yet another schematic cross-sectional view of the nanowire array of FIG. 1, according to an embodiment.

As shown in FIG. 4, the fluorescent nanowires 120 can have a cladding layer 160 surrounding a sidewall 120b of each of the fluorescent nanowires 120. The cladding layer 160 can be any suitable material substantially transparent to fluoresced light from the fluorescent nanowires 120. If the fluorescent nanowires 120 are embedded in the material 150, a refractive index of cladding layer 160 preferably is greater than the refractive index of the material 150 and smaller than the refractive index of the fluorescent nanowires 120.

The fluorescent nanowires 120 preferably are arranged in an array, such as a rectangular array, a hexagonal array, a square array, concentric ring. The term "pitch" is defined as a distance of a fluorescent nanowire 120 to a nearest neighbor of the fluorescent nanowire 120 along a direction parallel to the substrate 110. The term "array" as used herein means a spatial arrangement having a particular order. The fluorescent nanowires 120 preferably have a substantially uniform length.

The pitch of the nanowire array 100 and the radius, length, material of the fluorescent nanowires 120, and the material 150 are selected such that the fluorescent nanowires 120 fluoresce at a wavelength of a collective mode of the nanowire array 100. The pitch of the nanowire array 100 is preferably 100 nm to 10 microns, more preferably 300 nm to 1 micron. The radius of the fluorescent nanowires 120 is preferably 20 to 200 nm, more preferably 30 to 80 nm. The length of the fluorescent nanowires 120 is preferably from 100 nm to 10 microns, more preferably from 800 nm to 5 microns. The collective mode is a mode of the entire nanowire array 100 instead of a mode of individual fluorescent nanowires 120. When the fluorescent nanowires 120 fluoresce at the collective mode of the nanowire array 100, fluoresced light of the fluorescent nanowires 120 is substantially spatially and/or temporally coherent. Fluoresced light from such an nanowire array 100 has a much higher intensity than fluoresced light from an individual fluorescent nanowire and remains coherent. Namely, the nanowire array 100 can be a coherent light source. A coherent light source is a light source whose emitted light is substantially coherent, temporally, spatially, or both. A coherent light source can have application such as in quantum communication, in quantum cryptography, and as laser. The term "mode" as used herein means a possible standing electromagnetic wave in the nanowire array 100. A standing wave, also known as a stationary wave, is a wave that remains in a constant position. In a stationary medium, a standing wave can occur as a result of interference between two waves traveling in opposite directions. Not all standing waves are possible in a given system. Possible standing waves are dictated by characteristics of the system, such as, physical dimensions, shapes, chemical composition and/or characteristics of an environment in the vicinity of the system. The wavelength of the standing wave of a mode is called the wavelength of the mode.

Figure 5:
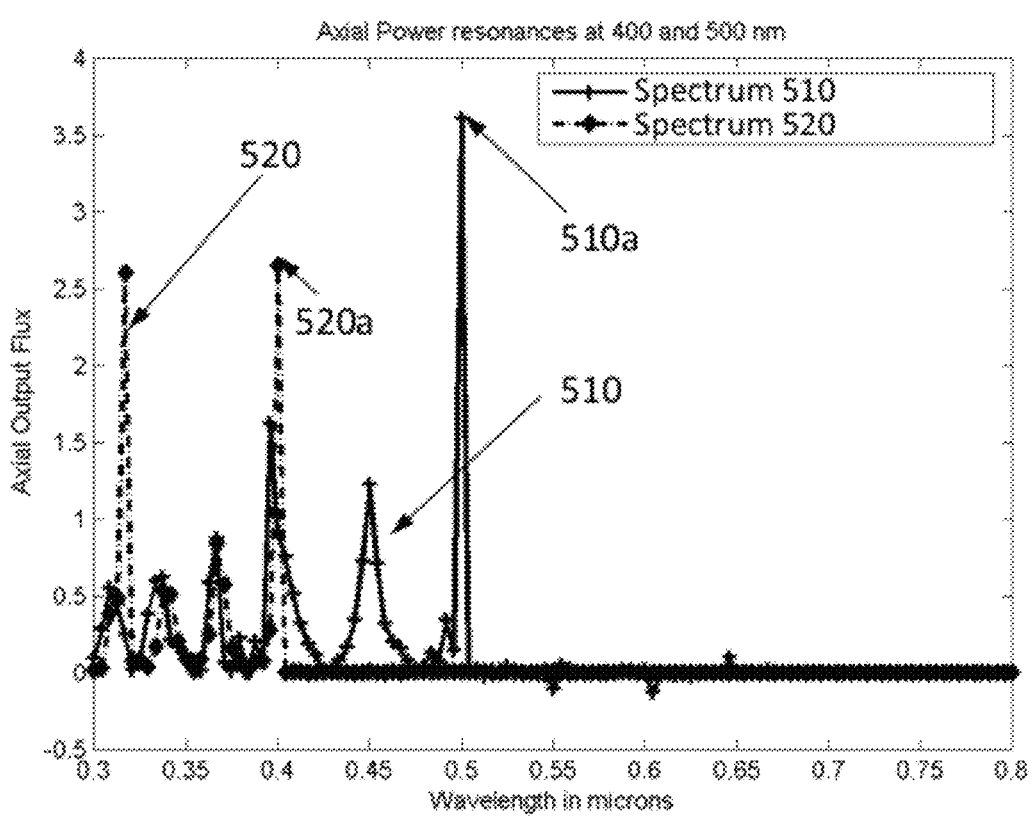
FIG. 5 shows simulated fluorescence spectra of two exemplary nanowire arrays in axial directions thereof.

FIG. 5 shows simulated fluorescence spectra of two exemplary nanowire arrays in axial directions thereof. The axial direction of a nanowire array means the direction perpendicular to the substrate of the nanowire array. The simulation is done using the finite difference time domain (FDTD) method. The FDTD method is a method of numerically simulating propagation of light in a structure and can be used to predict detailed characteristics of the propagation. Both spectra 510 and 520 show sharp peaks such as the peaks 510a and 520a. These peaks 510a and 520a are at wavelengths of collective modes of the exemplary nanowire arrays, respectively. Spectrum 510 is a fluorescence spectra of one of the exemplary nanowire arrays wherein the fluorescent nanowires are diamond and have a radius of 50 nm and pitch of 500 nm. Spectrum 520 is a fluorescence spectra of the other one of the exemplary nanowire arrays wherein the fluorescent nanowires are diamond, have a radius of 60 nm and pitch of 400 nm. In both spectra 510 and 520, the highest peaks 510a and 520a are at wavelengths substantially equal to the pitches of the exemplary nanowire arrays, respectively. This observation leads to a method of designing a nanowire array that fluoresces at a wavelength of interest, the method comprising: selecting the wavelength of interest; selecting a pitch of the nanowire array to be substantially equal to the wavelength of interest; selecting a radius of fluorescent nanowires of the nanowire array that maximizes fluorescence intensity of the nanowire array at the wavelength of interest; selecting a material of the fluorescent nanowires such that the fluorescent nanowires fluoresce at the wavelength of interest.

Figure 6:
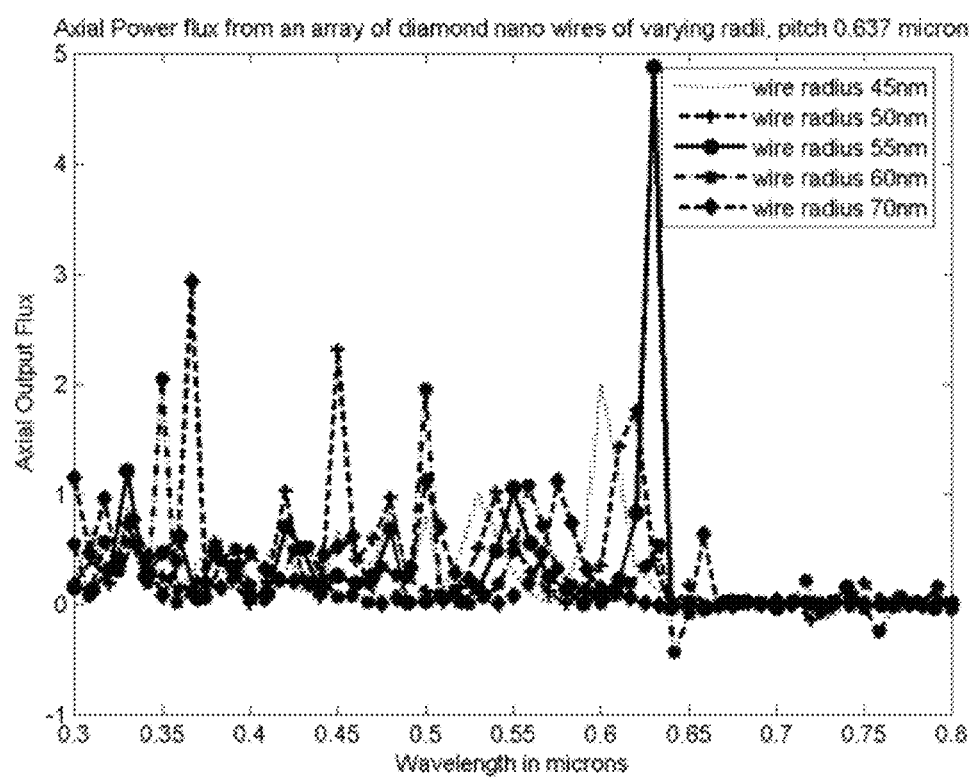
FIG. 6 shows simulated fluorescence spectra of several exemplary nanowire arrays in axial directions thereof, all of which have a same pitch of 637 nm and different radii.

FIG. 6 shows results of this method of design for a wavelength of interest at about 630 nm. Among five nanowire arrays all with a pitch of 637 nm but different radii of fluorescent nanowires, one nanowire arrays with fluorescent nanowires with a radius of about 55 nm maximizes fluorescence intensity of the nanowire array at the wavelength of interest.

Once a pitch of a nanowire array, a radius and a material of fluorescent nanowires in the nanowire array are determined, for examples, by the methods above, length of the fluorescent nanowires can be determined in a method as described below. A MODE solver is used to determine an effective refractive index $n_{eff}$ of the nanowire array at the wavelength of interest $\lambda_{air}$, given the pitch of the nanowire array and the radius and material of the fluorescent nanowires therein. An effective wavelength $\lambda_{eff}$ is defined as $\lambda_{eff}=\lambda_{air}/n_{eff}$. The length of the fluorescent nanowires is selected to be a multiple of $\lambda_{eff}$, which guarantees that the nanowire array has a collective mode at the wavelength of interest.

A MODE solver can accurately describe light propagation in a structure of any geometries. FDTD and MODE solvers from Lumerical Solutions, Inc. located at Vancouver, British Columbia, Canada were used.

Figure 7:
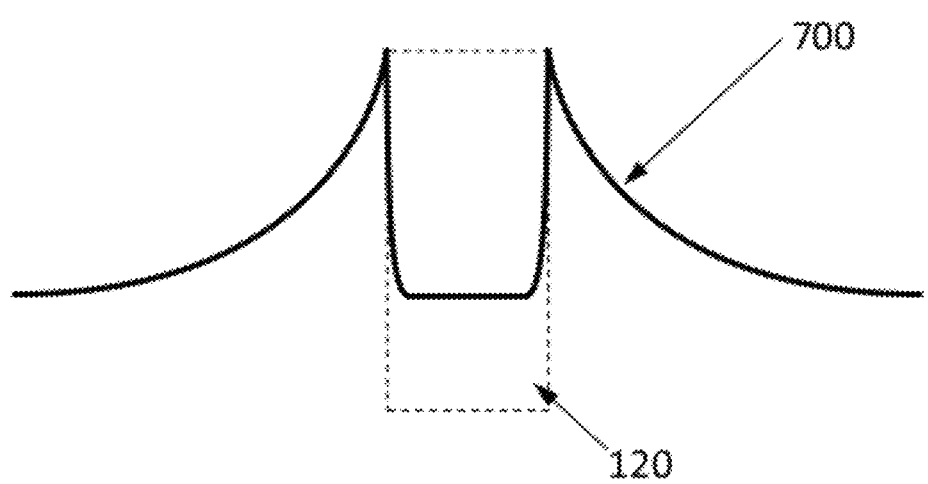
FIG. 7 shows a schematic light distribution of an air mode of the nanowire array.

The collective mode of the nanowire array can be an air mode. As shown in FIG. 7, the term "air mode" as used herein means a mode in which light intensity 700 is substantially zero within the fluorescent nanowires 120 and substantially non-zero outside the fluorescent nanowires 120.

Figure 8:
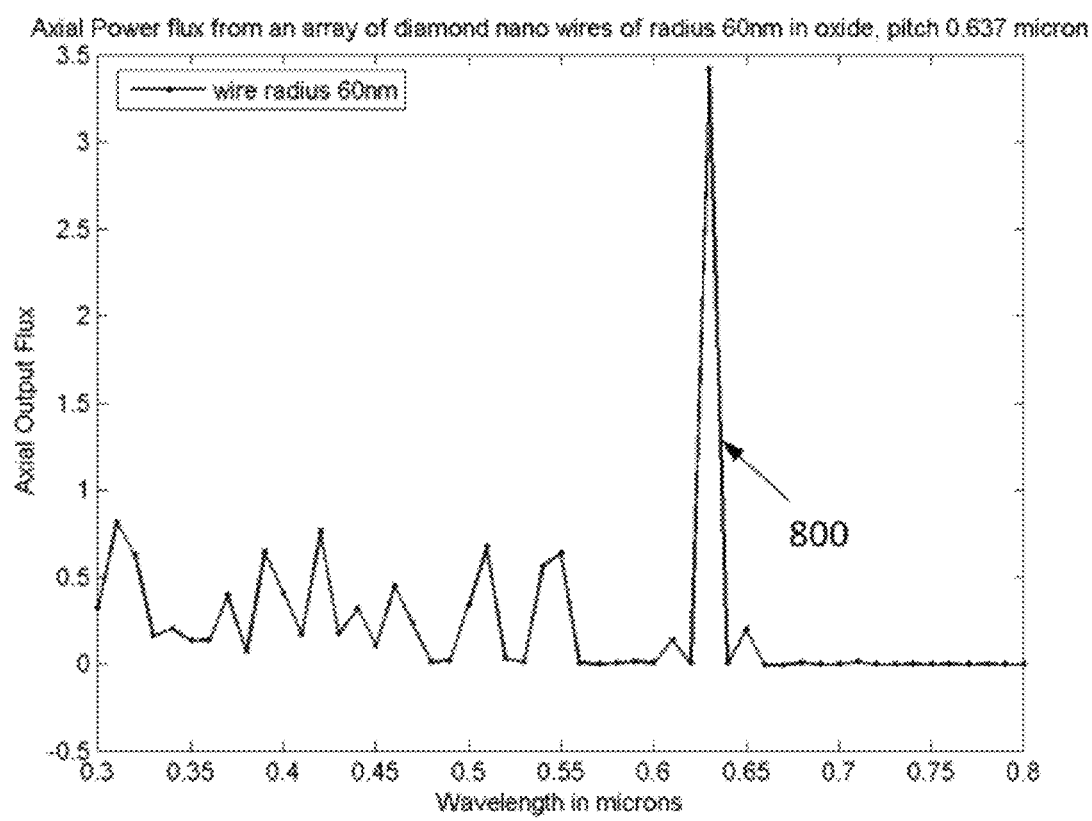
FIG. 8 shows a simulated fluorescence spectrum of an exemplary nanowire array in axial directions thereof, wherein the fluorescent nanowires are embedded in oxide.

FIG. 8 shows a simulated fluorescence spectrum of an exemplary nanowire array 100 in axial directions thereof, using the FDTD method. The fluorescent nanowires 120 of this exemplary nanowire array 100 has a pitch of 637 nm and a radius of 60 nm. The fluorescent nanowires 120 of this exemplary nanowire array 100 are embedded in a material 150 which is an oxide. Compared with the spectra of FIG. 6, it can be seen that embedding the fluorescent nanowires 120 in the material 150 shifts the radius that maximizes fluorescence intensity of the nanowire array 100 from about 55 nm to about 60 nm. A partially reflective layer 180 can be deposited in areas on the surface 150a around the fluorescent nanowires 120 as shown in FIGS. 2 and 3. The partially reflective layer 180 and the concave shape of the surface 150a can enhance sharpness of the peak 800. Sharpness of a peak can be defined by the Q value (Q factor, or quality factor) defined as center of the peak divided by a full width at half maximum (FWHM) of the peak. A higher Q value indicates a sharper peak.

Figure 9:
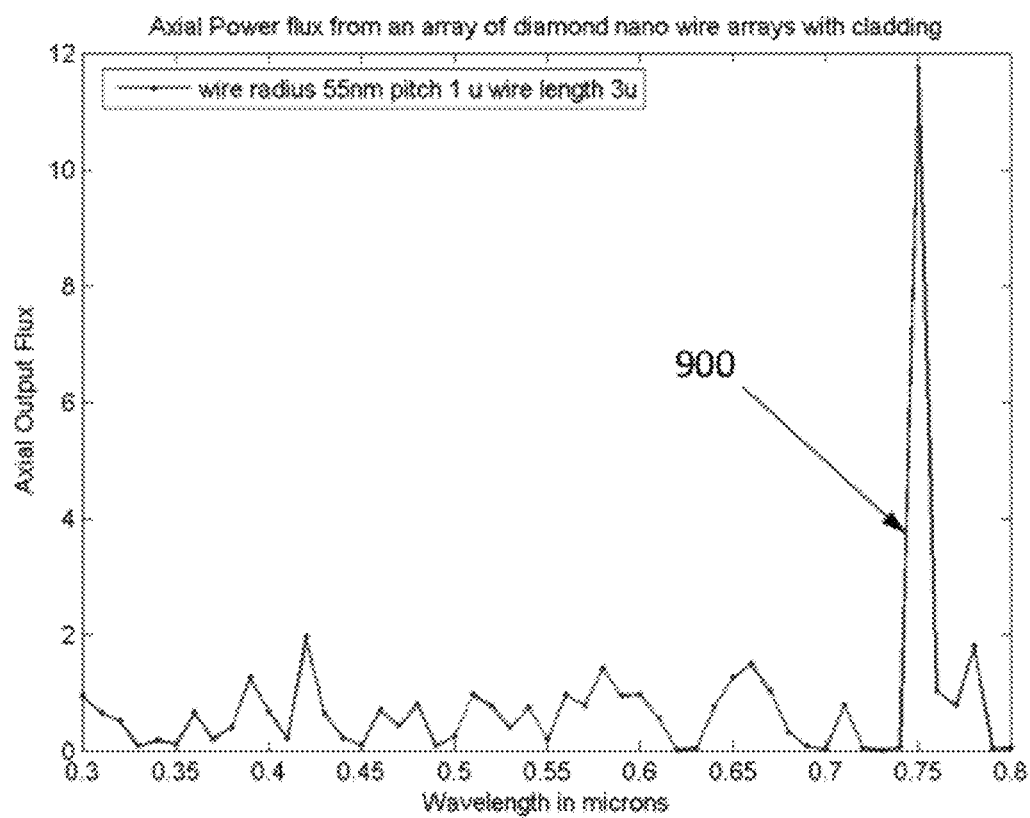
FIG. 9 shows a simulated fluorescence spectrum of an exemplary nanowire array in axial directions thereof, wherein the fluorescent nanowires have a cladding layer.

FIG. 9 shows a simulated fluorescence spectrum of an exemplary nanowire array 100 in axial directions thereof, using the FDTD method. The fluorescent nanowires 120 of this exemplary nanowire array 100 has a pitch of 1 micron, a radius of 55 nm and a height of 3 microns. The fluorescent nanowires 120 have a cladding layer 160 having a thickness of 300 nm. The fluorescent nanowires 120 are not embedded in a material 150. The effect of the cladding layer 160 is evident by comparing the spectrum of FIG. 9 with the spectrum of FIG. 8: the peak 900 of FIG. 9 is taller than the peak 800 of FIG. 8 and the peak 900 is shifted to 750 nm from the position of the peak 800 at 637 nm.

Figure 10:
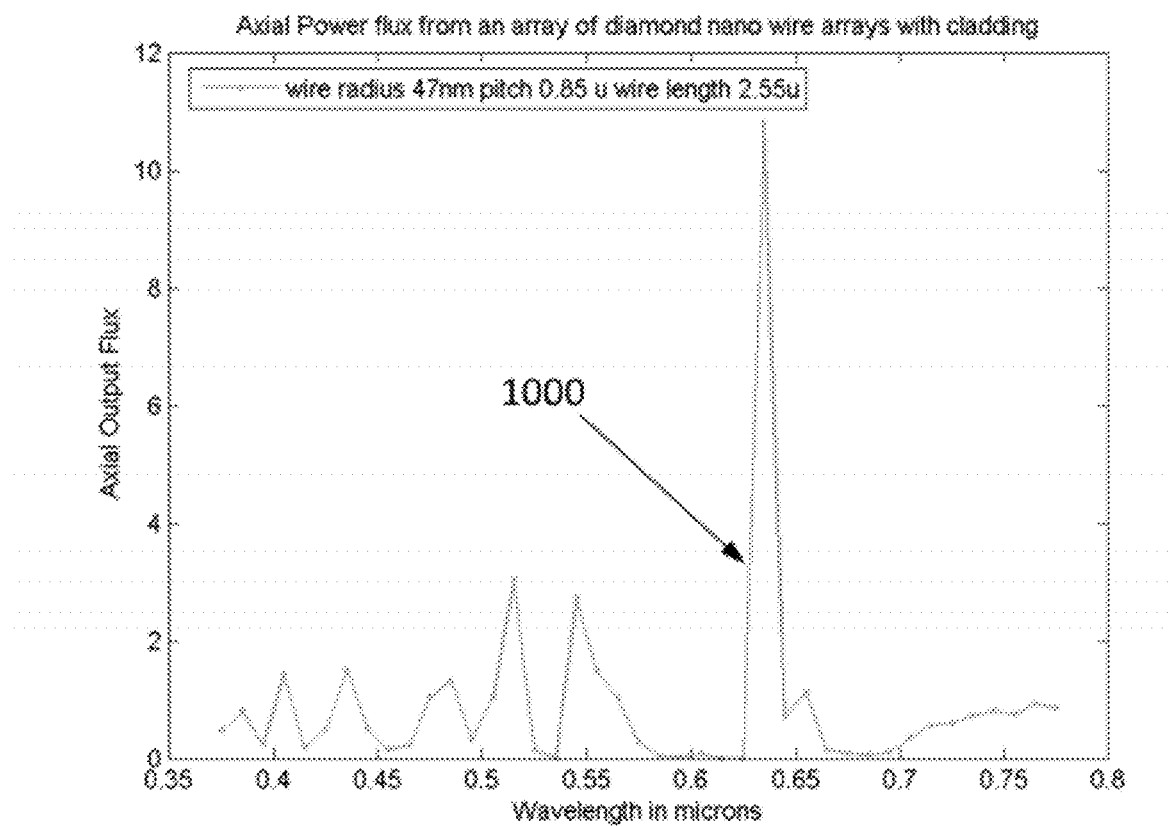
FIG. 10 shows a simulated fluorescence spectrum of an exemplary nanowire array in axial directions thereof, wherein the fluorescent nanowires have a cladding layer and wherein the nanowire array of FIG. 10 has dimensions to scale with the nanowire array of FIG. 9 and a peak position at 637 nm.

The peak 900 can be adjusted to 637 nm by scaling the physical dimensions of the nanowire array 100 (pitch, nanowire radius, nanowire length) by a factor of 637 nm/750 nm=0.85. FIG. 10 shows result of this scaling. FIG. 10 shows a simulated fluorescence spectrum of an exemplary nanowire array 100 in axial directions thereof, using the FDTD method. The fluorescent nanowires 120 of this exemplary nanowire array 100 has a pitch of 0.85 micron (=1 micron×0.85), a radius of 47 nm (=55 nm×0.85) and a height of 2.55 microns (=3 microns×0.85). The fluorescent nanowires 120 have a cladding layer 160 having a thickness of 255 nm (=300 nm×0.85). Indeed the peak 1000 of FIG. 10 falls at 637 nm.

The nanowire array 100 can be used as a light source such as a laser. According to an embodiment, a light source comprises one or more of the nanowire array 100. A method of using the nanowire array 100 as a light source comprises exposing the nanowire array 100 to a light, wherein the light preferable has a shorter wavelength than the wavelength of the wavelength of the collective mode of the nanowire array at which the fluorescent nanowires are operable to fluoresce. For example, if the wavelength of the collective mode is 500 nm, the light preferably has a wavelength less than 500 nm. The light can be provided by any suitable source such as LEDs, fluorescent lamps, mercury-vapor lamps, sodium-vapor lamps, discharge lamps, sunlight, incandescent lamps and/or laser.

The nanowire array 100 can be manufactured using an exemplary method, according to an embodiment, the exemplary method comprising: providing a substrate 110 having a layer of fluorescent material; coating a resist layer on the layer of fluorescent material; patterning the resist layer using a lithographic technique such as photolithography, e-beam lithography or holographic lithography such that a pattern corresponding to the fluorescent nanowires 120 is formed in the resist layer; forming the fluorescent nanowires 120 by etching the layer of fluorescent material; depositing the reflective layer 140 using a suitable deposition technique such as e-beam evaporation, thermal evaporation, or sputtering.

Another exemplary method of manufacturing the nanowire array 100, according to an embodiment, comprises: providing a substrate 110; growing the fluorescent nanowires 120 on the substrate by a suitable method such as the vapor-liquid-solid (VLS) method; depositing the reflective layer 140 using a suitable deposition technique such as e-beam evaporation, thermal evaporation, or sputtering. The VLS method is a method for the growth of one-dimensional structures, such as nanowires, from chemical vapor deposition. Growth of a crystal through direct adsorption of a gas phase on to a solid surface is generally very slow. The VLS method circumvents this by introducing a catalytic liquid alloy phase which can rapidly adsorb a vapor to supersaturation levels, and from which crystal growth can subsequently occur from nucleated seeds at the liquid-solid interface. The physical characteristics of nanowires grown in this manner depend, in a controllable way, upon the size and physical properties of the liquid alloy.

The exemplary methods can also comprise a step of depositing a fluorescent material on the fluorescent nanowires 120 by a suitable technique such as e-beam evaporation, thermal evaporation, sputtering, chemical vapor deposition (CVD), atomic layer deposition (ALD), electrochemical deposition, followed by an optional annealing step.

The exemplary methods can also comprise a step of embedding a fluorescent material in the fluorescent nanowires by a suitable technique such as ion implantation, irradiation with electrons, followed by an optional annealing step.

The exemplary methods can also comprise a step of coating a dielectric nanowire around a fluorescent or an active emitting material such a nanowire laser. By a suitable technique such as ALD or CVD.

The exemplary methods can also comprise a step of coating a cladding layer surrounding a sidewall 120*b* of the fluorescent nanowires, using a suitable technique such as e-beam evaporation, thermal evaporation, sputtering, chemical vapor deposition (CVD), atomic layer deposition (ALD), electrochemical deposition.

The exemplary methods can also comprise a step of filling space between the fluorescent nanowires with the material 150 by a suitable technique such as e-beam evaporation, thermal evaporation, sputtering, chemical vapor deposition (CVD), atomic layer deposition (ALD), electrochemical deposition, followed by an optional step of planarization such as chemical-mechanical planarization (CMP).

The foregoing detailed description has set forth various embodiments of the devices and/or processes by the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation.

The subject matter described herein sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A nanowire array, comprising a substrate, a plurality of fluorescent nanowires extending essentially perpendicularly from the substrate and a reflective layer at least disposed on the substrate in at least a portion of areas between the fluorescent nanowires; wherein the fluorescent nanowires are operable to fluoresce at a wavelength of a collective mode of the nanowire array.

2. The nanowire array of claim 1, wherein the substrate comprises a material comprising silicon, sapphire, glass, silicon oxide, diamond, ZnO, a transparent non-absorbing dielectric material, or a combination thereof.

3. The nanowire array of claim 1, wherein the substrate has a thickness of about 0.1 to about 1 mm.

4. The nanowire array of claim 1, wherein the substrate comprises substantially a same material as or different materials from the fluorescent nanowires.

5. The nanowire array of claim 1, wherein the reflective layer comprises a material selected from a group consisting of ZnO, Al, Au, Ag, Pd, Cr, Cu, and a combination thereof.

6. The nanowire array of claim 1, wherein the reflective layer has a reflectance of at least 50% for fluoresced light from the fluorescent nanowires.

7. The nanowire array of claim 1, wherein the reflective layer has a thickness of at least about 5 nm.

8. The nanowire array of claim 1, wherein the reflective layer is also disposed on the substrate in at least a portion of areas covered by the fluorescent nanowires.

9. The nanowire array of claim 1, wherein the fluorescent nanowires are at least partially embedded in a material.

10. The nanowire array of claim 1, wherein the fluorescent nanowires comprise one or more fluorescent material.

11. The nanowire array of claim 1, wherein the fluorescent nanowires comprise a material selected from the group consisting of inorganic fluorescent materials, organic fluorescent materials, quantum dots and a combination thereof.

12. The nanowire array of claim 1, wherein the fluorescent nanowires are one or more non-fluorescent material with one or more fluorescent material embedded therein and covered thereby.

13. The nanowire array of claim 1, wherein the fluorescent nanowires are diamond with color centers embedded therein.

14. The nanowire array of claim 1, further comprising a cladding layer surrounding a sidewall of each of the fluorescent nanowires wherein the cladding layer is a material substantially transparent to fluoresced light from the fluorescent nanowires.

15. The nanowire array of claim 1, wherein the fluorescent nanowires have a substantially uniform length.

16. The nanowire array of claim 1, wherein fluoresced light of the fluorescent nanowires is substantially spatially and/or temporally coherent.

17. The nanowire array of claim 1, wherein the wavelength of the collective mode of the nanowire array is substantially equal to a pitch of the nanowire array.

18. The nanowire array of claim 1, wherein a length of the fluorescent nanowires is a multiple of an effective wavelength $\lambda_{eff}$ defined as $\lambda_{eff} = \lambda_{air}/n_{eff}$, wherein $\lambda_{air}$ is the wavelength of interest and $n_{eff}$ is an effective refractive index of the nanowire array at $\lambda_{air}$.

19. The nanowire array of claim 1, wherein the collective mode is an air mode.

20. The nanowire array of claim 1, wherein a pitch of the nanowire array is about 100 nm to about 10 micron, a length of the fluorescent nanowires is from about 100 nm to about 10 microns, and/or a radius of the fluorescent nanowires is about 20 to about 200 nm.

21. A light source comprising one or more of the nanowire array of claim 1.

22. The nanowire array of claim 9, wherein the material comprises silicon oxide, silicon nitride, ZnO, $Al_2O_3$, diamond or a combination thereof.

23. The nanowire array of claim 9, wherein a surface of the material is substantially coextensive with a surface of each of the fluorescent nanowires such that the surface of each of the fluorescent nanowires is exposed.

24. The nanowire array of claim 9, wherein the fluorescent nanowires are entirely embedded in the material without any exposed surface.

25. The nanowire array of claim 9, wherein a top surface of the material has a concave shape configured to focus fluoresced light from the fluorescent nanowires.

26. The nanowire array of claim 9, wherein a refractive index of the material is smaller than a refractive index of the fluorescent nanowires.

27. The nanowire array of claim 9, further comprising a partial reflective layer deposited on a top surface of the material in at least a portion of areas around top surfaces of the fluorescent nanowires wherein no portion of the top surfaces of the fluorescent nanowires overlaps the partial reflective layer.

28. The nanowire array of claim 13, wherein the color centers are nitrogen vacancy defects.

29. The nanowire array of claim 13, wherein the color centers are embedded randomly in the fluorescent nanowires.

30. The nanowire array of claim 13, wherein at least 10% of the fluorescent nanowires have at least one color center.

31. The nanowire array of claim 14, a refractive index of cladding layer is smaller than a refractive index of the fluorescent nanowires.

32. The nanowire array of claim 14, wherein the fluorescent nanowires are at least partially embedded in a material and wherein a refractive index of cladding layer is greater than the refractive index of the material.

33. A method of using a nanowire array comprising exposing the nanowire array to light, wherein the nanowire array comprises a substrate, a plurality of fluorescent nanowires extending essentially perpendicularly from the substrate and a reflective layer at least disposed on the substrate in at least a portion of areas between the fluorescent nanowires; and wherein the fluorescent nanowires are operable to fluoresce at a wavelength of a collective mode of the nanowire array.

34. The method of claim 33, wherein the light has a shorter wavelength than the wavelength of the wavelength of the collective mode of the nanowire array.

35. The method of claim 33, wherein the light is provided by a source selected from the group consisting of LEDs, fluorescent lamps, mercury-vapor lamps, sodium-vapor lamps, discharge lamps, sunlight, incandescent lamps, laser and combinations thereof.

36. A method comprising:
  selecting the wavelength of interest;
  selecting a pitch of the nanowire array to be substantially equal to the wavelength of interest;
  selecting a radius of fluorescent nanowires of the nanowire array that maximizes fluorescence intensity of the nanowire array at the wavelength of interest; and
  selecting a material of the fluorescent nanowires such that the fluorescent nanowires fluoresce at a wavelength of interest.

* * * * *